(12) United States Patent
Doyle et al.

(10) Patent No.: US 7,898,023 B2
(45) Date of Patent: Mar. 1, 2011

(54) RECESSED CHANNEL ARRAY TRANSISTOR (RCAT) STRUCTURES

(75) Inventors: Brian S. Doyle, Portland, OR (US); Ravi Pillarisetty, Portland, OR (US); Gilbert Dewey, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/826,954

(22) Filed: Jun. 30, 2010

(65) Prior Publication Data

US 2010/0264494 A1    Oct. 21, 2010

Related U.S. Application Data

(63) Continuation of application No. 12/130,581, filed on May 30, 2008, now Pat. No. 7,800,166.

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. .......................... 257/327; 257/407; 438/589

(58) Field of Classification Search .................. 257/327, 257/407, E21.615, E29.264; 438/289, 589
See application file for complete search history.

(56) References Cited

U.S. PATENT DOCUMENTS

| | | | |
|---|---|---|---|
| 5,763,922 A | 6/1998 | Chau et al. | |
| 6,048,769 A | 4/2000 | Chau et al. | |
| 6,198,142 B1 | 3/2001 | Chau et al. | |
| 6,538,278 B1 | 3/2003 | Chau | |
| 6,541,343 B1 | 4/2003 | Murthy et al. | |
| 6,797,556 B2 | 9/2004 | Murthy et al. | |
| 6,858,478 B2 | 2/2005 | Chau et al. | |
| 6,858,483 B2 | 2/2005 | Doczy et al. | |
| 6,864,145 B2 | 3/2005 | Hareland et al. | |
| 6,897,098 B2 | 5/2005 | Hareland et al. | |
| 6,906,366 B2 | 6/2005 | Hsu | |
| 6,914,295 B2 | 7/2005 | Chau et al. | |
| 6,921,711 B2 | 7/2005 | Cabral et al. | |
| 6,953,719 B2 | 10/2005 | Doczy et al. | |
| 6,970,373 B2 | 11/2005 | Chau et al. | |
| 6,972,225 B2 | 12/2005 | Doczy et al. | |
| 6,974,733 B2 | 12/2005 | Boyanov et al. | |
| 7,005,366 B2 | 2/2006 | Chau et al. | |
| 7,037,790 B2 | 5/2006 | Chang et al. | |
| 7,042,009 B2 | 5/2006 | Shaheen et al. | |
| 7,056,794 B2 | 6/2006 | Ku et al. | |

(Continued)

OTHER PUBLICATIONS

Sung-Woong Chung et al., "Highly Scalable Saddle-Fin(S-Fin) Transistor for Sub-50 nm DRAM Technology", Symposium on VLSI Technology Digest of Technical Papers, IEEE, 2 pgs, 2006.

*Primary Examiner* — Phuc T Dang
(74) *Attorney, Agent, or Firm* — Cool Patent, P.C.; Joseph P. Curtin (57) ABSTRACT

Recessed channel array transistor (RCAT) structures and method of formation are generally described. In one example, an electronic device includes a semiconductor substrate, a first fin coupled with the semiconductor substrate, the first fin comprising a first source region and a first drain region, and a first gate structure of a recessed channel array transistor (RCAT) formed in a first gate region disposed between the first source region and the first drain region, wherein the first gate structure is formed by removing a sacrificial gate structure to expose the first fin in the first gate region, recessing a channel structure into the first fin, and forming the first gate structure on the recessed channel structure.

14 Claims, 5 Drawing Sheets

U.S. PATENT DOCUMENTS

| | | |
|---|---|---|
| 7,071,064 B2 | 7/2006 | Doyle et al. |
| 7,078,750 B2 | 7/2006 | Hareland et al. |
| 7,098,507 B2 | 8/2006 | Tang et al. |
| 7,105,390 B2 | 9/2006 | Brask et al. |
| 7,138,305 B2 | 11/2006 | Datta et al. |
| 7,145,246 B2 | 12/2006 | Hareland et al. |
| 7,208,361 B2 | 4/2007 | Shah et al. |
| 7,217,611 B2 | 5/2007 | Kavalieros et al. |
| 7,268,058 B2 | 9/2007 | Chau et al. |
| 7,279,375 B2 | 10/2007 | Radosavljevic et al. |
| 7,316,949 B2 | 1/2008 | Doczy et al. |
| 7,329,913 B2 | 2/2008 | Brask et al. |
| 7,358,121 B2 | 4/2008 | Chau et al. |
| 7,598,560 B2 | 10/2009 | Kavalieros et al. |
| 7,629,643 B2 | 12/2009 | Pillarisetty et al. |
| 2004/0191980 A1 | 9/2004 | Rios et al. |
| 2005/0269644 A1 | 12/2005 | Brask et al. |
| 2005/0272191 A1 | 12/2005 | Shah et al. |
| 2006/0006522 A1 | 1/2006 | Doczy et al. |
| 2006/0128131 A1 | 6/2006 | Chang |
| 2008/0090397 A1 | 4/2008 | Brask et al. |
| 2008/0157162 A1 | 7/2008 | Doyle et al. |
| 2008/0157225 A1 | 7/2008 | Datta et al. |
| 2008/0169512 A1 | 7/2008 | Doyle et al. |
| 2008/0237575 A1 | 10/2008 | Jin et al. |
| 2008/0237672 A1 | 10/2008 | Doyle et al. |
| 2008/0237678 A1 | 10/2008 | Datta et al. |
| 2008/0237719 A1 | 10/2008 | Doyle et al. |
| 2008/0237751 A1 | 10/2008 | Shah et al. |
| 2008/0258207 A1 | 10/2008 | Radosavljevic et al. |
| 2008/0272430 A1 | 11/2008 | Hur |
| 2009/0001438 A1 | 1/2009 | Doyle et al. |
| 2009/0166680 A1 | 7/2009 | Pillarisetty et al. |
| 2009/0166741 A1 | 7/2009 | Pillarisetty et al. |
| 2009/0166742 A1 | 7/2009 | Pillarisetty et al. |
| 2009/0166743 A1 | 7/2009 | Pillarisetty et al. |
| 2009/0168498 A1 | 7/2009 | Pillarisetty et al. |
| 2009/0206404 A1 | 8/2009 | Pillarisetty et al. |
| 2009/0206405 A1 | 8/2009 | Doyle et al. |
| 2009/0294839 A1 | 12/2009 | Doyle et al. |
| 2010/0065888 A1 | 3/2010 | Shaheen et al. |

RECESSED CHANNEL ARRAY TRANSISTOR (RCAT) STRUCTURES

CROSS-REFERENCE TO RELATED PATENT APPLICATION

The present patent application is a continuation patent application of U.S. patent application Ser. No. 12/130,581, filed May 30, 2008, now U.S. Pat. No. 7,800,166 B2 to Doyle et al., the disclosure of which is incorporated by reference herein.

RECESSED CHANNEL ARRAY TRANSISTOR (RCAT) STRUCTURES

BACKGROUND

Generally, recessed channel array transistor (RCAT) devices demonstrate decreased off-current leakage compared with higher performance non-planar or multi-gate transistor devices.

BRIEF DESCRIPTION OF THE DRAWINGS

Embodiments disclosed herein are illustrated by way of example, and not by way of to limitation, in the figures of the accompanying drawings in which like reference numerals refer to similar elements and in which.

For simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of recessed channel array transistors (RCAT) structures and method of formation are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout the specification to "one embodiment" or "an embodiment" means that a particular feature, structure or characteristic described in connection with the embodiment is included in at least one embodiment. Thus, appearances of the phrases "in one embodiment" or "in an embodiment" in various places throughout the specification are not necessarily referring to the same embodiment. Furthermore, the particular features, structures or characteristics may be combined in any suitable manner in one or more embodiments.

Figure 1:
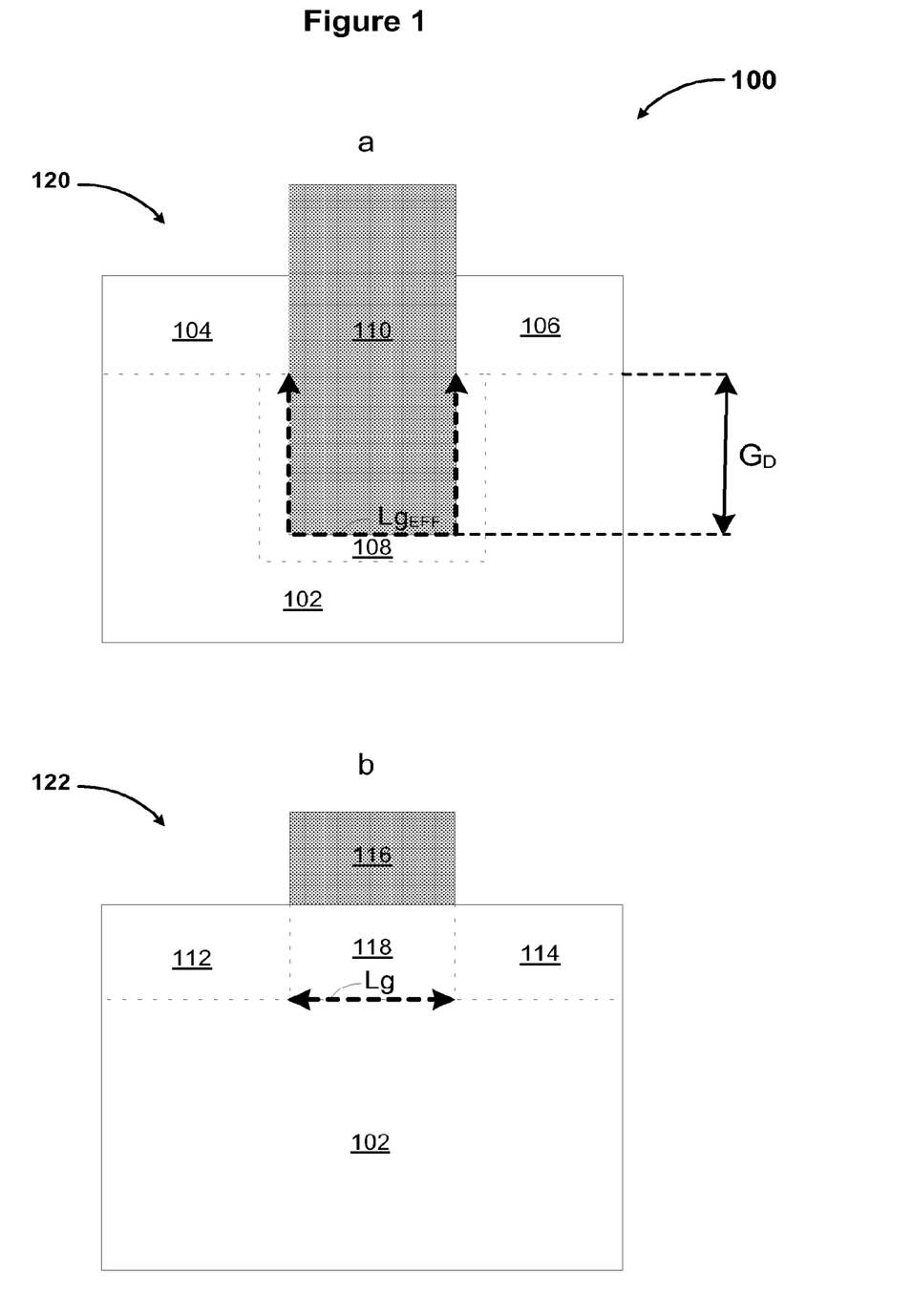
FIG. 1 is an elevation cross-section schematic of an electronic device comprising a first gate structure of a recessed channel array transistor (RCAT) and a second gate structure of a multi-gate transistor, according to but one embodiment.

FIG. 1 is an elevation cross-section schematic of an electronic device comprising a first gate structure of a recessed channel array transistor (RCAT) and a second gate structure of a multi-gate transistor, according to but one embodiment. In an embodiment, an electronic device 100 comprises a first gate structure 110 of a RCAT 120 as depicted in FIG. 1a and a second gate structure 116 of a multi-gate transistor 122 as depicted in FIG. 1b. FIGS. 1a-b may represent a cross-section along or parallel with one or more fin structures 104, 106, 112, 114.

In an embodiment according to FIG. 1a, an electronic device 100 comprises a RCAT device 120. In an embodiment, RCAT 120 includes a semiconductor substrate 102, a first fin 104, 106, a source region 104 of a first fin, a drain region 106 of a first fin, a channel region 108, to and a first gate structure 110 of a RCAT, coupled as shown. Semiconductor substrate 102 may comprise silicon (Si) in an embodiment. In other embodiments, semiconductor substrate 102 includes any suitable semiconductor material for fabricating a multi-gate electronic device 100.

First fin 104, 106 may be a multi-gate fin in an embodiment. First fin 104, 106 may comprise doped silicon, in an embodiment, to provide a first source region 104 and a first drain region 106. Channel region 108 may be an active region or stream through which electrons may flow from first source 104 to first drain 106. In an embodiment, channel region 108 is doped to provide a threshold voltage ($V_t$) for a RCAT 120. RCAT 120 may comprise an effective gate length ($Lg_{EFF}$) that is about equal to the distance labeled $Lg_{EFF}$ depicted by the dashed arrow along the perimeter of first gate structure 110 adjacent to the channel region 108 between the first source 104 and first drain 106 regions.

In an embodiment, electronic device 100 comprises semiconductor substrate 102, a first fin 104, 106 coupled with the semiconductor substrate 102, the first fin comprising a first source region 104 and a first drain region 106. Electronic device 100 may further comprise a first gate structure 110 of a RCAT 120 formed in a first gate region, the first gate region being disposed between the first source region 104 and the first drain region 106.

Electronic device 100 may comprise a multi-gate or other non-planar electronic device that is formed by a process that replaces a sacrificial gate structure with a subsequent gate structure 110 such as a replacement metal gate (RMG) process. Embodiments disclosed herein may allow formation of a lower leakage RCAT 120 for DRAM or SRAM, for example, in a multi-gate transistor process flow. In an embodiment, the first gate structure 110 is formed by removing a sacrificial gate structure to expose the first fin 104, 106 in the first gate region, recessing a channel structure 108 into the first fin 104, 106 and forming the first gate structure 110 on the recessed channel structure 108. A first gate structure 110 may comprise a gate dielectric structure coupled with the channel structure 108 and a gate electrode structure coupled with the gate dielectric structure.

Recessing a channel structure 108 into the first fin 104, 106 may comprise removing first fin 104, 106 material in a gate region between the first source region 104 and the second source region 106 of the first fin 104, 106 and/or removing semiconductor substrate 102 material underlying the exposed first fin 104, 106 to a depth, $G_D$. Increasing the depth, $G_D$, may increase the effective gate length, $Lg_{EFF}$, which may reduce short channel effects of RCAT 120. Such technique to form a first gate structure 110 may be further described with respect to FIGS. 2-4.

In an embodiment according to FIG. 1b, electronic device 100 comprises a multi-gate transistor 122. In an embodiment, multi-gate transistor 122 includes a semiconductor substrate 102, a second fin 112, 114, 118 a source region 112 of the second fin, a drain region 114 of the second fin, a gate region 118 of the second fin, and a second gate structure 116 of a multi-gate transistor 122, coupled as shown. Semiconductor substrate 102 may be the same or a contiguous portion of semiconductor substrate of FIG. 1a. RCAT 120 and multi-gate transistor 122 may be formed, for example, on the same semiconductor substrate 102. Second gate structure 116 may comprise a gate dielectric structure coupled with the gate region 118 of the second fin and a gate electrode structure coupled with the gate dielectric structure.

Second fin 112, 114, 118 may be a multi-gate fin in an embodiment. In an embodiment, second fin 112, 114, 118 comprises a tri-gate fin. Second fin 112, 114, 118 may comprise doped silicon, in an embodiment, to provide a second source region 112, a second drain region 114, and a second gate region 118. Second fin 112, 114, 118 may be a continuous material structure in an embodiment. Second gate region 118 of second fin 112, 114, 118 may be disposed between the second source region 112 and second drain region 114. In an embodiment, second gate region 118 provides a channel region for multi-gate transistor 122. Electrons may flow from second source region 112 to second drain region 114 through the channel region 118 when active. Multi-gate transistor 122 may comprise a drawn gate length (Lg) that is about equal to the physical distance between the first source 112 and first drain 114 regions across second gate region 118 as depicted by the dashed arrow in FIG. 1b.

In an embodiment, electronic device 100 further comprises a second fin 112, 114, 118 coupled with the semiconductor substrate 102, the second fin 112, 114, 118 comprising a second source region 112, a second drain region 114, and a second gate region 118 wherein the second gate region 118 is disposed between the second source region 112 and the second drain region 114. Electronic device 100 may further comprise a second gate structure 116 of a multi-gate transistor 122 formed on the second gate region 118 of the second fin 112, 114, 118. In an embodiment, the multi-gate transistor 122 comprises a higher performance logic device and the RCAT 120 comprises a lower leakage memory device.

Second gate structure 116 of multi-gate transistor 122 may be formed by a sacrificial gate replacement method similar to the first gate structure 110 of RCAT 120. In an embodiment, a sacrificial gate structure is simultaneously formed and removed from RCAT 120 and multi-gate transistor 122 prior to forming first gate structure 110 and second gate structure 116. In an embodiment, the multi-gate transistor 122 is protected from processes wherein the RCAT 120 is etched to recess the channel structure 108 to a depth, $G_D$. In an embodiment, the first gate structure 110 is formed, in part, by recessing the channel structure 108 to a depth, $G_D$, that is between about half to about four times the drawn gate length, Lg, of the second gate structure 116 of the multi-gate transistor 122. Depth, $G_D$, may be the distance from the base of the first fin 104, 106 to the bottom of a trench structure formed by recessing the channel structure 108 as depicted. Increasing the depth, $G_D$, may increase $Lg_{EFF}$ and reduce short channel effects of RCAT 120. Such effect may allow formation of a RCAT 120 having a $Lg_{EFF}$ that may be substantially larger than a drawn gate length, Lg, thus allowing potential scaling to thinner fins used to form an electronic device 100.

Figure 2:
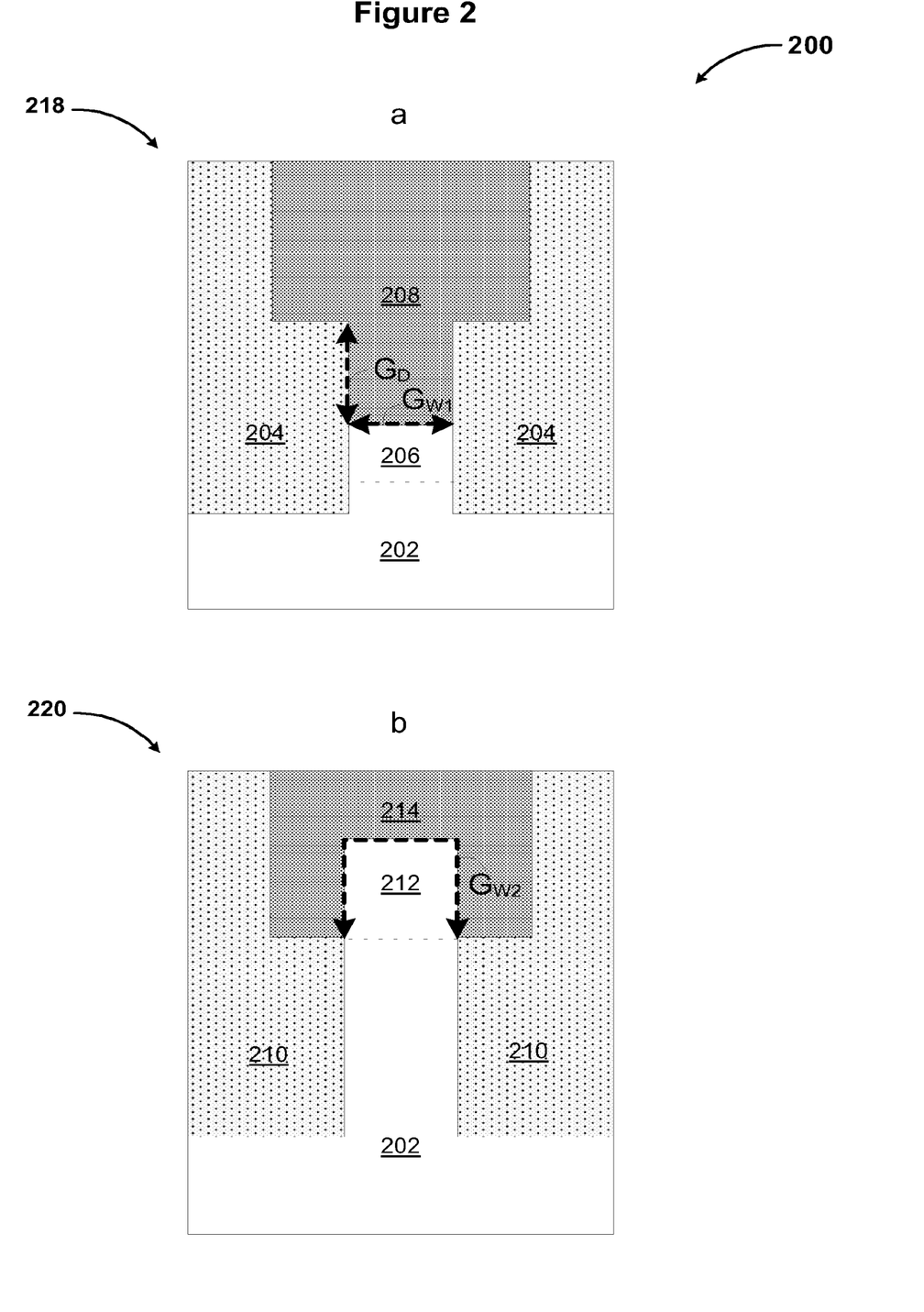
FIG. 2 is another elevation cross-section schematic of an electronic device comprising a first gate structure of a recessed channel array transistor (RCAT) and a second gate structure of a multi-gate transistor, according to but one embodiment.

FIG. 2 is another elevation cross-section schematic of an electronic device comprising a first gate structure of a recessed channel array transistor (RCAT) and a second gate structure of a multi-gate transistor, according to but one embodiment. FIGS. 2a-b may be cross-sections through a first gate structure 110 and a second gate structure 116, respectively, in a manner that is perpendicular or 90 degrees from the views of FIGS. 1a-b. FIG. 2a may be a depiction of a RCAT 218 and FIG. 2b may be a depiction of a multi-gate transistor 220. FIG. 2 may include embodiments already described with respect to FIG. 1.

In an embodiment according to FIG. 2a, an electronic device 200 comprises a RCAT 218. RCAT 218 may include a semiconductor substrate 202, dielectric material 204, channel structure 206, and first gate structure 208, coupled as shown. In an embodiment, semiconductor substrate 202 is analogous to semiconductor substrate 102, channel structure 206 is analogous to channel structure 108, and first gate structure 208 is analogous to first gate structure 110.

In an embodiment, an electronic device 200 comprises a semiconductor substrate 202, a first fin 104, 106 coupled with the semiconductor substrate 202, the first fin comprising a first source region 104 and a first drain region 106, and a first gate structure 208 of a RCAT 218 formed in a first gate region disposed between the first source region 104 and the first drain region 106 wherein the first gate structure 208 is formed by removing a sacrificial gate structure to expose the first fin in the first gate region, recessing a channel structure 206 into the first fin 104, 106, and forming the first gate structure 208 on the recessed channel structure 206. In an embodiment, the semiconductor substrate 202 comprises silicon and the recessed channel 206 comprises silicon.

In an embodiment, dielectric material 204 is coupled with the semiconductor substrate 202, the recessed channel structure 206, and the first gate structure 208 as depicted. Dielectric material 204 may comprise silicon oxide ($SiO_2$) or any other suitable dielectric material and may comprise trench oxide and/or inter-layer dielectric structures. In an embodiment, the dielectric material 204 coupled with the channel structure 206 comprises trench oxide. Dielectric material 204 may also be coupled with the first source region 104 and the first drain region 106 of the first fin 104, 106.

A first gate structure 208 may comprise a gate dielectric coupled with the recessed channel structure 206 and a gate electrode coupled with the gate dielectric. In an embodiment, the gate dielectric comprises a dielectric constant, k, greater than about 4 including, for example, $SiO_2$. In another embodiment, the gate dielectric comprises higher-k dielectric materials including, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate electrode of first gate structure 208 may include materials that comprise a bandgap energy between about 4.1 electron volts (eV) and about 4.9 eV. In another embodiment, gate electrode of first gate structure 208 comprises a work-function between about 4.1 eV and about 4.6 eV for n-type metal-oxide-semiconductor (NMOS) devices and a workfunction between about 4.6 eV and about 4.9 eV for p-type metal-oxide-semiconductor (PMOS) devices. Gate electrode of first gate structure 208 may include, for example, transition metal/nitrides such as tantalum nitride (TaN) or titanium nitride (TiN), or combinations thereof. Such examples may be suitable for a semiconductor substrate 202 comprising silicon. Gate electrode materials of first gate structure 208 may include other workfunction ranges for semiconductor substrates 202 that comprise other materials such as, for example, group III-V or group II-VI semiconductors.

In an embodiment according to FIG. 2b, an electronic device 200 comprises a multi-gate transistor 220. Multi-gate transistor 220 may include semiconductor substrate 202, dielectric material 210, gate region 212 of second fin, and second gate structure 214, coupled as shown. Gate region 212 of second fin may provide a channel structure for multi-gate transistor 220. In an embodiment, semiconductor substrate 202 is analogous to semiconductor substrate 102, gate region 212 of second fin is analogous to gate region 118, and second gate structure 214 is analogous to second gate structure 116.

In an embodiment, an electronic device 200 comprises a second fin coupled with the semiconductor substrate 202, the second fin comprising a second source region 112, a second drain region 114, and a second gate region 212 wherein the second gate region 212 is disposed between the second source region 112 and the second drain region 114. Electronic device 200 may further comprise a second gate structure 214 of a multi-gate transistor 220 formed on the second gate region 212 of the second fin.

In an embodiment, the first gate structure 208 of the RCAT 218 comprises a first gate width, $G_{W1}$, that is about equal to the distance across recessed channel structure 206 as depicted. The second gate structure 214 may comprise a second gate width, $G_{W2}$, that is about equal to the perimeter of the gate region 212 of the second fin. In an embodiment, the first gate width, $G_{W1}$, is greater than the second gate width, $G_{W2}$. In other embodiments, the first gate width $G_{W1}$, may be about equal to or less than the second gate width, $G_{W2}$. In another embodiment, the first gate width, $G_{W1}$, is greater than about two times the second gate width, $G_{W2}$. A multi-gate transistor 220 may, for example, have a gate width, $G_{W2}$, less than about 20 nanometers (nm) for a gate length, $L_g$, of about 30 nm to about 50 nm. A RCAT 218 may have a gate width, $G_{W1}$, that is greater than about two times wider than $G_{W2}$. RCAT 218 may, for example, have a gate width, $G_{W1}$, greater than about 40 nm. In an embodiment, a gate region of a first fin for forming a RCAT 218 is wider than a gate region 212 of a second fin for forming a multi-gate transistor 220.

In an embodiment, the first gate structure 208 comprises a depth, $G_D$, that is between about half to about four times the drawn gate length, Lg, of the second gate structure 214. Depth, $G_D$, of FIG. 2a may be analogous to the depth, $G_D$, depicted with respect to FIG. 1a. Increasing depth, $G_D$, may decrease short channel effects, reduce off-current leakage, or combinations thereof, by increasing the effective gate length, $Lg_{EFF}$, of RCAT 218.

In an embodiment, RCAT 218 comprises a first gate leakage current. First gate leakage current may be a characteristic of the RCAT 218 that depends on thicknesses and electrical properties of the materials used therein. As used herein, gate leakage current refers to gate leakage into the drain when the gate is in the "off" state and the drain voltage is high, not necessarily the leakage between the gate and other terminals. First gate leakage current of RCAT 218 may be measured in current per length of gate width. In an embodiment, RCAT 218 comprises a first gate leakage current of less than about 100 picoamps (pA) per micron of gate width, $G_{W1}$. Multi-gate transistor 220 may comprise a second gate leakage current that is greater than the first gate leakage current of RCAT 218. In an embodiment, the second gate leakage current of multi-gate transistor 220 is about 500 nanoamps (nA) per micron of gate width, $G_{W2}$. Such embodiments of leakage current are merely examples and other leakage currents are possible within the scope of this disclosure. In an embodiment, RCAT 218 comprises a first gate leakage current that is less than about one thousand times smaller than the second gate leakage current of multi-gate transistor 220.

First gate leakage current may be reduced by a variety of techniques. For example, first gate leakage current may be reduced by increasing the thickness or dielectric constant, k, of a gate dielectric of first gate structure 208 coupled with the channel structure 206, or using a gate electrode in first gate structure 208 with a lower bandgap energy than the second gate structure 214, or modulating electrical properties of the channel structure 206 with doping such as threshold voltage implant, or suitable combinations thereof.

Figure 3:
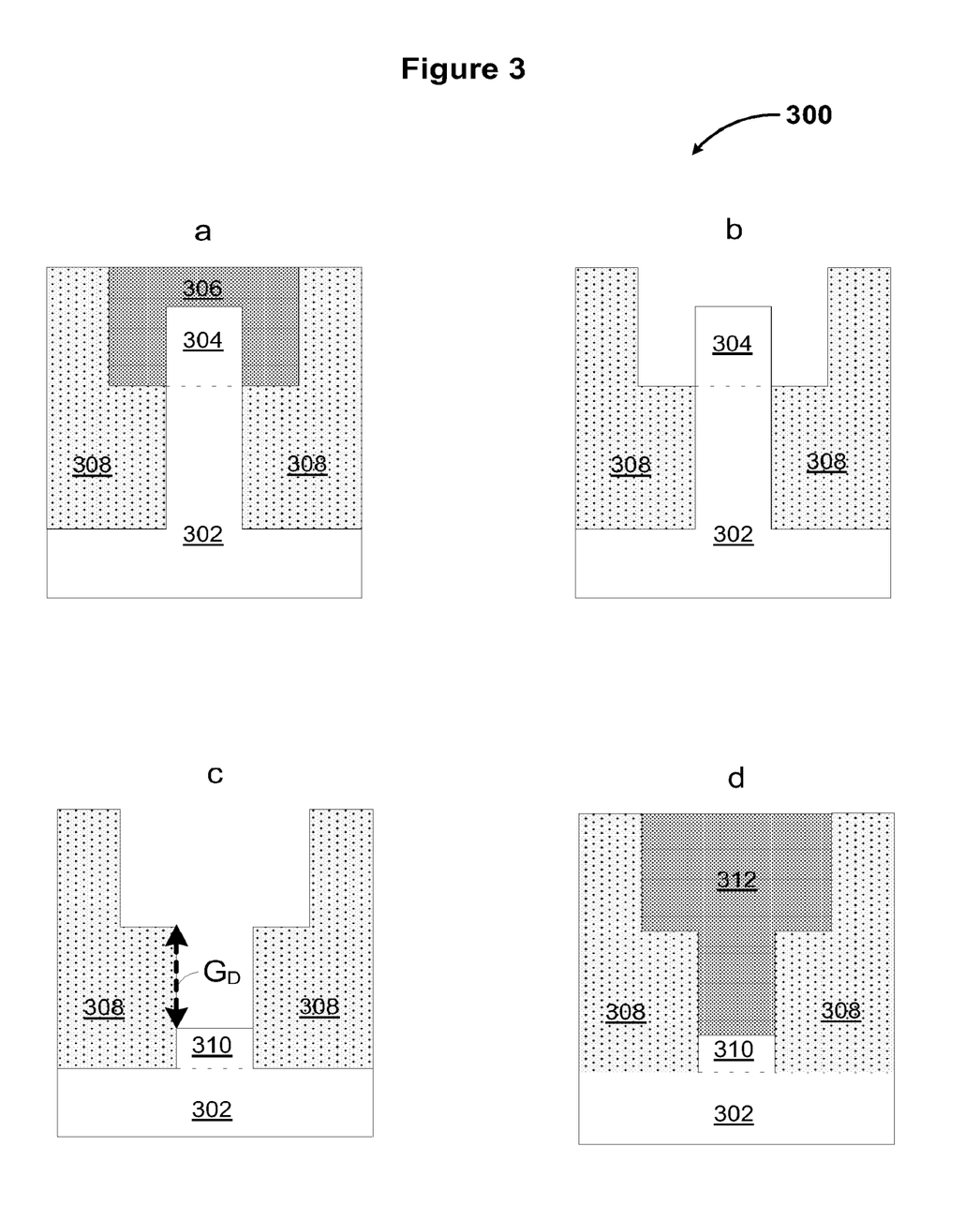
FIG. 3 is an elevation cross-section schematic of a process to form an electronic device comprising a first gate structure of a recessed channel array transistor (RCAT), according to but one embodiment.

FIG. 3 is an elevation cross-section schematic of a process to form an electronic device comprising a first gate structure of a recessed channel array transistor (RCAT), according to but one embodiment. Cross-sections of FIG. 3 may depict formation of an electronic device 300 from a perspective similar to FIG. 2. Formation of a sacrificial gate structure 308 may be depicted in FIG. 3a, removal of sacrificial gate structure 308 may be depicted in FIG. 3b, recessing a channel structure 306 may be depicted in FIG. 3c, and formation of a first gate structure 312 of a RCAT may be depicted in FIG. 3d. An electronic device 300 may accord with embodiments already described with respect to FIG. 1-2.

In an embodiment according to FIG. 3a, an electronic device 300 comprises a semiconductor substrate 302, multi-gate fin 304, sacrificial gate structure 306, and dielectric material 308, coupled as shown. FIG. 3a may be a depiction of an electronic device 300 after formation of a sacrificial gate structure 306 on multi-gate fin 304. Sacrificial gate structure 306 may comprise a sacrificial gate dielectric coupled to the multi-gate fin 304 and a sacrificial gate electrode including, for example, polysilicon, coupled with the sacrificial gate dielectric.

In an embodiment according to FIG. 3b, an electronic device 300 comprises a semiconductor substrate 302, multi-gate fin 304, and dielectric material 308, coupled as shown. FIG. 3b may be a depiction of an electronic device 300 according to FIG. 3a after removal of the sacrificial gate structure 306 to expose multi-gate fin 304. Sacrificial gate structure 306 may be removed by an etch process or any other suitable removal method. In an embodiment, one or more RCAT devices 120, 218 and one or more multi-gate transistors 122, 220 are simultaneously processed according to embodiments described with respect to FIGS. 3a-b. Actions associated with FIGS. 3c-d may be particular to RCAT devices 120, 218. Multi-gate transistors 122, 220 may be protected during actions associated with FIGS. 3c-d to prevent etching of the multi-gate fin 304. A second gate structure 214 may be formed directly on multi-gate fin 304 to form a multi-gate transistor 122, 220.

In an embodiment according to FIG. 3c, an electronic device 300 comprises a semiconductor substrate 302, channel structure 310, and dielectric material 308, coupled as shown. FIG. 3c may be a depiction of an electronic device 300 according to FIG. 3b after recessing of a channel structure 310 into the multi-gate fin 304. Recessing a channel structure 310 into the multi-gate fin 304 may comprise removing multi-gate fin 304 and underlying semiconductor substrate 302 material of a similar width to a depth, $G_D$. Depth, $G_D$, of FIG. 3c may be analogous to $G_D$ described with respect to FIGS. 1-2. Multi-gate fin 304 and/or underlying semiconductor substrate 302 material may be removed by etching or any other suitable removal method.

Channel structure 310 may comprise material of semiconductor substrate 302 that provides an electron path from source to drain in a RCAT device 300. In an embodiment, channel structure 310 comprises doped silicon to provide suitable electrical characteristics for a channel material for a RCAT.

In an embodiment according to FIG. 3d, an electronic device 300 comprises a semiconductor substrate 302, dielectric material 308, channel structure 310, and first gate structure 312 of a RCAT. FIG. 3d may be a depiction of FIG. 3c after formation of a first gate structure 312. First gate structure 312 may be analogous to first gate structure 208 described with respect to FIG. 2. First gate structure 312 may be formed by depositing a gate dielectric to at least the channel structure 310 and depositing a gate electrode to the gate dielectric. Gate dielectric may also be deposited to exposed surfaces of dielectric material 308. Deposition of the gate dielectric or the gate electrode of the first gate structure 312 may be accomplished by any suitable deposition method including chemical vapor deposition (CVD), physical vapor deposition (PVD), atomic layer deposition (ALD), epitaxial deposition methods, oxide growth, or any other suitable method. Deposition of gate dielectric and gate electrode of the first gate structure 312 may be followed by other processes such as, for example, polishing or planarization.

Figure 4:
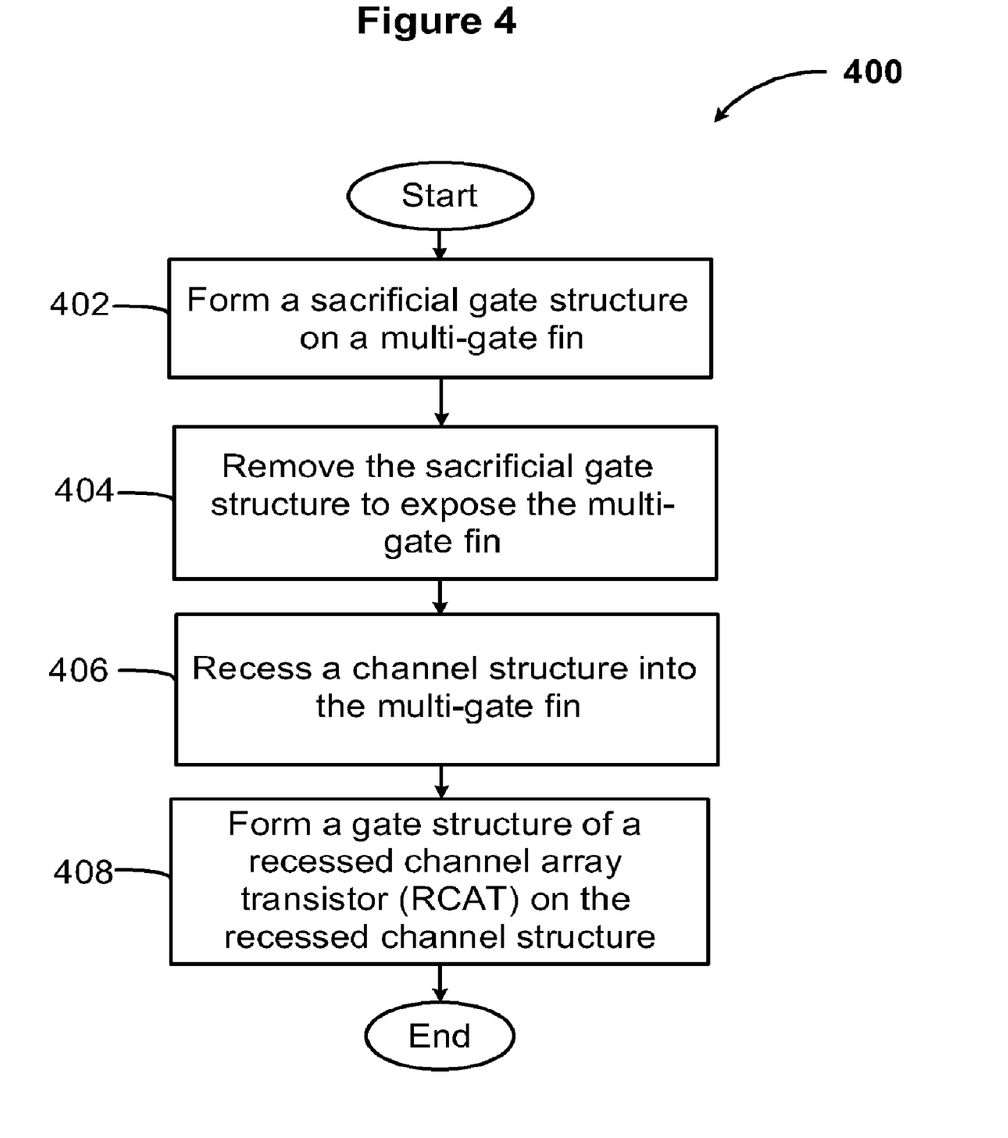
FIG. 4 is a flow diagram of a method for forming an electronic device comprising a first gate structure of a recessed channel array transistor (RCAT), according to but one embodiment.

FIG. 4 is a flow diagram of a method for forming an electronic device comprising a first gate structure of a recessed channel array transistor (RCAT), according to but one embodiment. In an embodiment, a method 400 includes forming a sacrificial gate structure on a multi-gate fin at box 402, removing the sacrificial gate structure to expose the multi-gate fin at box 404, recessing a channel structure into the multi-gate fin at box 406, and forming a gate structure of a recessed channel array transistor (RCAT) on the recessed channel structure at box 408. A "first fin" and/or "second fin" described with respect to method 400 may be analagous to first fin and/or second fin already described with respect to FIGS. 1-3.

In an embodiment, a method 400 includes forming a first sacrificial gate structure on a first fin 402, the first fin being coupled with a semiconductor substrate. Forming the first sacrificial gate structure on the first fin 402 may comprise depositing a sacrificial gate dielectric to the first fin and depositing a sacrificial gate electrode comprising polysilicon to the sacrificial gate dielectric.

Method 400 may further include removing the first sacrificial gate structure to expose the first fin 404. In an embodiment, removing the first sacrificial gate structure to expose the first fin comprises etching to remove the sacrificial gate structure. Other removal techniques may be used in other embodiments.

Method 400 may further include recessing a channel structure into the first fin 406. Recessing a channel structure 406 may comprise selectively removing the first fin and underlying semiconductor material to form a recessed channel structure. Recessing 406 may be accomplished by etching away semiconductor material disposed between trench dielectric material or interlayer dielectric material. In an embodiment, recessing the channel structure into the first fin comprises etching away the material of the first fin to a depth that is between about half to about four times the drawn gate length of a second gate structure of a multi-gate transistor. Increasing the depth ($G_D$) may reduce short channel effects in the RCAT by increasing the effective gate length of the first gate structure.

In an embodiment, method 400 further comprises forming a first gate structure of a recessed channel array transistor (RCAT) on the recessed channel structure 408. Forming the first gate structure of the recessed channel array transistor (RCAT) on the recessed channel structure 408 may comprise depositing a gate dielectric to the recessed channel structure, the gate dielectric comprising a dielectric constant, k, that is greater than about 4 and depositing a gate electrode to the gate dielectric, the gate electrode comprising a bandgap energy between about 4.1 electron volts (eV) and about 4.9 eV. Any suitable deposition method may be used including atomic layer deposition (ALD), physical vapor deposition (PVD), chemical vapor deposition (CVD), among others.

In an embodiment, method 400 further comprises forming a second sacrificial gate structure on a second fin, the second fin being coupled with the semiconductor substrate wherein forming the second sacrificial gate structure on the second fin occurs simultaneously with forming the first sacrificial gate structure on the first fin 402. Method 400 may further include removing the second sacrificial gate structure to expose the second fin wherein removing the second sacrificial gate structure occurs simultaneously with removing the first sacrificial gate structure 404, protecting the second fin such that the gate region of the second fin remains after recessing the channel structure into the first fin 406, and forming a second gate structure of a multi-gate transistor on the second fin. The second fin may be protected, for example, by a patterning technique such as masking the multi-gate transistor devices with a material to prevent removal during a recess etch 406. Other methods of protection may be used in other embodiments.

In an embodiment, forming a first gate structure of a RCAT 408 comprises forming a first gate structure having a first gate width and forming a second gate structure of a multi-gate transistor comprises forming a second gate structure having a second gate width. In an embodiment, the first gate width, $G_{W1}$, is greater than about two times the second gate width, $G_{W1}$. In another embodiment, the RCAT comprises a memory device having a first current leakage characteristic and the multi-gate transistor comprises a logic device having a second current leakage characteristic wherein the first current leakage characteristic is less than about one thousand times smaller than the second current leakage characteristic.

Method 400 may further include other semiconductor fabrication processes such as lithography, etch, thin films deposition, planarization, diffusion, metrology, or any other action associated with semiconductor fabrication. In one or more embodiments, method 400 includes embodiments already described with respect to FIGS. 1-3.

Various operations may be described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 5:
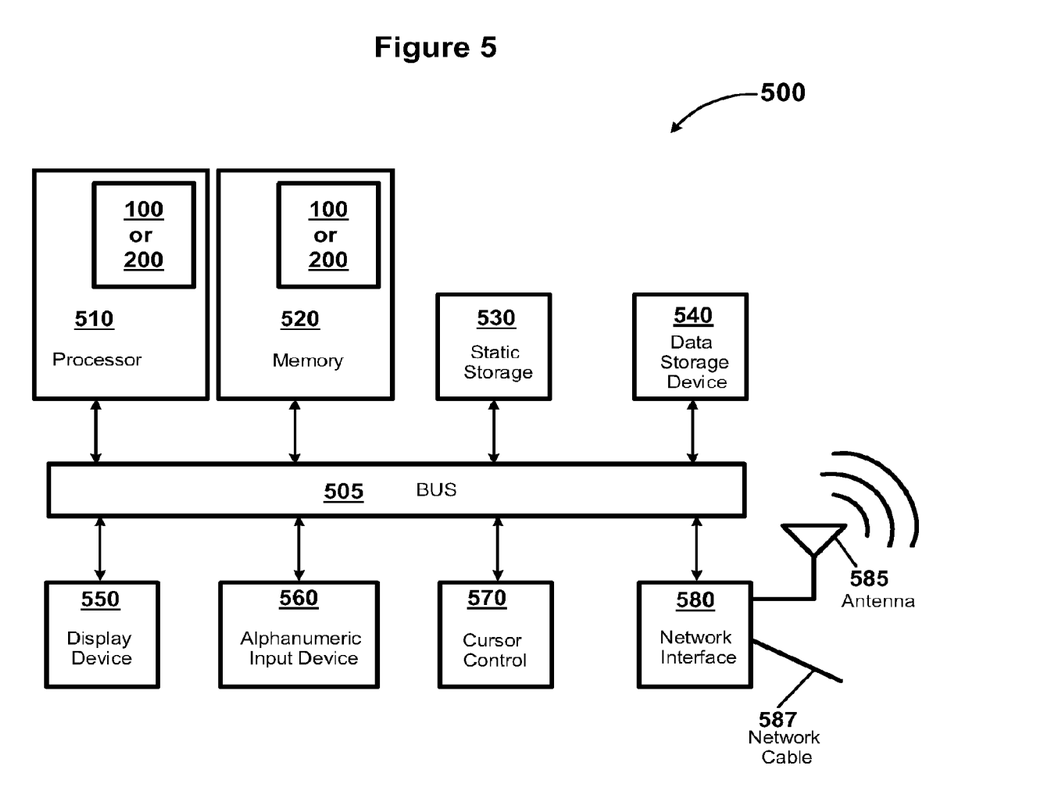
FIG. 5 is a diagram of an example system in which an electronic device as described herein may be used, according to but one embodiment.

FIG. 5 is a diagram of an example system in which an electronic device as described herein may be used, according to but one embodiment. System 500 is intended to represent a range of electronic systems (either wired or wireless) including, for example, desktop computer systems, laptop computer systems, personal computers (PC), wireless telephones, personal digital assistants (PDA) including cellular-enabled PDAs, set top boxes, pocket PCs, tablet PCs, DVD players, or servers, but is not limited to these examples and may include other electronic systems. Alternative electronic systems may include more, fewer and/or different components.

In one embodiment, electronic system 500 includes an electronic device 100, 200 as described herein. In an embodiment an electronic device 100, 200 as described herein is part of an electronic system's processor 510 or memory 520, or combinations thereof. Electronic system 500 may include a processor 510 and memory 520 coupled with the processor 510, wherein the processor 510 or the memory 520, or combinations thereof, comprise one or more electronic devices 100, 200 as described herein. In an embodiment, electronic devices 100, 200 comprise one or more multi-gate transistor devices. In an embodiment, the processor 510 or the memory 520, or combinations thereof, comprise a p-type metal-oxide-semiconductor (PMOS) electronic device 100, 200 as described herein or an n-type metal-oxide-semiconductor (NMOS) electronic device 100, 200 as described herein.

Electronic system 500 may include bus 505 or other communication device to communicate information, and processor 510 coupled to bus 505 that may process information. While electronic system 500 may be illustrated with a single processor, system 500 may include multiple processors and/or co-processors. In an embodiment, processor 510 includes an electronic device 100, 200 in accordance with embodiments described herein. System 500 may also include random access memory (RAM) or other storage device 520 (may be referred to as memory), coupled to bus 505 and may store information and instructions that may be executed by processor 510.

Memory 520 may also be used to store temporary variables or other intermediate information during execution of instructions by processor 510. Memory 520 is a flash memory device in one embodiment. In another embodiment, memory 520 includes an electronic device 100, 200 as described herein.

System 500 may also include read only memory (ROM) and/or other static storage device 530 coupled to bus 505 that may store static information and instructions for processor 510. Data storage device 540 may be coupled to bus 505 to store information and instructions. Data storage device 540 such as a magnetic disk or optical disc and corresponding drive may be coupled with electronic system 500.

Electronic system 500 may also be coupled via bus 505 to display device 550, such as a cathode ray tube (CRT) or liquid crystal display (LCD), to display information to a user. Alphanumeric input device 560, including alphanumeric and other keys, may be coupled to bus 505 to communicate information and command selections to processor 510. Another type of user input device is cursor control 570, such as a mouse, a trackball, or cursor direction keys to communicate information and command selections to processor 510 and to control cursor movement on display 550.

Electronic system 500 further may include one or more network interfaces 580 to provide access to network, such as a local area network. Network interface 580 may include, for example, a wireless network interface having antenna 585, which may represent one or more antennae. Network interface 580 may also include, for example, a wired network interface to communicate with remote devices via network cable 587, which may be, for example, an Ethernet cable, a coaxial cable, a fiber optic cable, a serial cable, or a parallel cable.

In one embodiment, network interface 580 may provide access to a local area network, for example, by conforming to an Institute of Electrical and Electronics Engineers (IEEE) standard such as IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Previous or subsequent versions of the Bluetooth standard may also be supported.

In addition to, or instead of, communication via wireless LAN standards, network interface(s) 580 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of the description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

What is claimed is:

1. An apparatus, comprising:
   a semiconductor substrate;
   a first fin coupled with the semiconductor substrate, the first fin comprising a first source region and a first drain region;
   a first gate structure of a recessed channel array transistor (RCAT) formed in a first gate region disposed between the first source region and the first drain region, wherein the first gate structure is formed by removing a sacrificial gate structure to expose the first fin in the first gate region, recessing a channel structure into the first fin, and forming the first gate structure on the recessed channel structure;
   a second fin coupled with the semiconductor substrate, the second fin comprising a second source region, a second drain region, and a second gate region wherein the second gate region is disposed between the second source region and the second drain region; and
   a second gate structure of a multi-gate transistor formed on the second gate region of the second fin wherein the multi-gate transistor comprises a logic device and wherein the RCAT comprises a memory device.

2. An apparatus according to claim 1, wherein the first gate structure of the RCAT comprises a first gate width, and wherein the second gate structure of the multi-gate transistor comprises a second gate width, wherein the first gate width is greater than about two times the second gate width.

3. An apparatus according to claim 1, wherein the first gate structure of the RCAT is further formed by recessing the channel structure to a depth that is between about half to about four times the drawn gate length of the second gate structure of the multi-gate transistor.

4. An apparatus according to claim 1, wherein the RCAT comprises a first gate leakage current and the multi-gate transistor comprises a second gate leakage current, wherein the first gate leakage current is less than about one thousand times smaller than the second gate leakage current.

5. An apparatus according to claim 1, wherein the semiconductor substrate comprises silicon, the recessed channel structure comprises silicon, and wherein the first gate structure comprises:
  a gate dielectric coupled with the recessed channel structure, the gate dielectric comprising a dielectric constant, k, greater than about 4; and
  a gate electrode coupled with the gate dielectric, the gate electrode comprising a bandgap energy between about 4.1 electron volts (eV) and about 4.9 eV.

6. An apparatus according to claim 1, further comprising:
  a dielectric material coupled with the first source region and the first drain region of the first fin and also coupled with the semiconductor substrate, the recessed channel structure, and the first gate structure.

7. An apparatus according to claim 2, wherein the first gate structure of the RCAT is further formed by recessing the channel structure to a depth that is between about half to about four times the drawn gate length of the second gate structure of the multi-gate transistor.

8. An apparatus according to claim 7, wherein the RCAT comprises a first gate leakage current and the multi-gate transistor comprises a second gate leakage current, wherein the first gate leakage current is less than about one thousand times smaller than the second gate leakage current.

9. An apparatus according to claim 5, wherein the first gate structure of the RCAT comprises a first gate width, and wherein the second gate structure of the multi-gate transistor comprises a second gate width, wherein the first gate width is greater than about two times the second gate width.

10. An apparatus according to claim 9, wherein the first gate structure of the RCAT is further formed by recessing the channel structure to a depth that is between about half to about four times the drawn gate length of the second gate structure of the multi-gate transistor.

11. An apparatus according to claim 10, wherein the RCAT comprises a first gate leakage current and the multi-gate transistor comprises a second gate leakage current, wherein the first gate leakage current is less than about one thousand times smaller than the second gate leakage current.

12. An apparatus according to claim 6, wherein the first gate structure of the RCAT comprises a first gate width, and wherein the second gate structure of the multi-gate transistor comprises a second gate width, wherein the first gate width is greater than about two times the second gate width.

13. An apparatus according to claim 12, wherein the first gate structure of the RCAT is further formed by recessing the channel structure to a depth that is between about half to about four times the drawn gate length of the second gate structure of the multi-gate transistor.

14. An apparatus according to claim 13, wherein the RCAT comprises a first gate leakage current and the multi-gate transistor comprises a second gate leakage current, wherein the first gate leakage current is less than about one thousand times smaller than the second gate leakage current.

* * * * *